United States Patent
Yamamoto et al.

(10) Patent No.: US 9,496,037 B2
(45) Date of Patent: Nov. 15, 2016

(54) MEMORY CIRCUIT

(71) Applicant: Japan Science and Technology Agency, Saitama (JP)

(72) Inventors: Shuichiro Yamamoto, Kanagawa (JP); Yusuke Shuto, Kanagawa (JP); Satoshi Sugahara, Kanagawa (JP)

(73) Assignee: Japan Science and Technology Agency, Saitama (JP)

( * ) Notice: Subject to any disclaimer, the term of this patent is extended or adjusted under 35 U.S.C. 154(b) by 0 days.

(21) Appl. No.: 14/546,668

(22) Filed: Nov. 18, 2014

(65) Prior Publication Data

US 2015/0070975 A1    Mar. 12, 2015

Related U.S. Application Data

(63) Continuation of application No. PCT/JP2013/054051, filed on Feb. 19, 2013.

(30) Foreign Application Priority Data

May 18, 2012    (JP) .................................. 2012-114988

(51) Int. Cl.
*G11C 14/00* (2006.01)
*G11C 11/16* (2006.01)
*G11C 13/00* (2006.01)

(52) U.S. Cl.
CPC ....... *G11C 14/0081* (2013.01); *G11C 11/1675* (2013.01); *G11C 13/0069* (2013.01); *G11C 14/0054* (2013.01); *G11C 2013/0076* (2013.01)

(58) Field of Classification Search
USPC ................................................ 365/148, 154
See application file for complete search history.

(56) References Cited

U.S. PATENT DOCUMENTS

| | | |
|---|---|---|
| 6,205,065 B1 | 3/2001 | Sugibayashi |
| 7,130,224 B2 | 10/2006 | Moriyama et al. |
| 2004/0042247 A1 | 3/2004 | Takahashi et al. |
| 2005/0226033 A1 | 10/2005 | Moriyama et al. |
| 2008/0084743 A1 | 4/2008 | Grant et al. |

(Continued)

FOREIGN PATENT DOCUMENTS

| | | |
|---|---|---|
| CN | 1685439 A | 10/2005 |
| JP | H02-081398 A | 3/1990 |

(Continued)

OTHER PUBLICATIONS

Yusuke Shuto et al., "Evaluation and Control of Break-Even Time of Nonvolatile Static Random Access Memory Based on Spin-Transistor Architecture with Spin-Transfer-Torque Magnetic Tunnel Junctions," Japanese Journal of Applied Physics 51 (2012), Mar. 30, 2012, pp. 04212-1-040212-3 (3 pages), The Japan Society of Applied Physics, Japan.

(Continued)

*Primary Examiner* — Hoai V Ho
*Assistant Examiner* — Minh Dinh
(74) *Attorney, Agent, or Firm* — Michael Best and Friedrich

(57) ABSTRACT

A memory circuit includes: a bistable circuit (30) that writes data; nonvolatile elements (MTJ1, MTJ2) that store the data written in the bistable circuit into the nonvolataole element in a nonvolatile manner, and restore the data stored in a nonvolatile manner into the bistable circuit; and a determining unit (50) that does not store the data written in the bistable circuit into the nonvolatile elements when the data in the bistable circuit is the same as the data in the nonvolatile elements, but stores the data in the bistable circuit into the nonvolatile elements when the data in the bistable circuit is not the same as the data in the nonvolatile elements.

14 Claims, 17 Drawing Sheets

(56) References Cited

U.S. PATENT DOCUMENTS

| | | |
|---|---|---|
| 2010/0046298 A1 | 2/2010 | Tsumura |
| 2010/0202191 A1 | 8/2010 | Ahn et al. |
| 2011/0161578 A1* | 6/2011 | Kim .................. G11C 11/406 |
| | | 711/106 |
| 2011/0273925 A1 | 11/2011 | Yamamoto et al. |
| 2012/0155158 A1* | 6/2012 | Higo .................. G11C 11/1677 |
| | | 365/158 |

FOREIGN PATENT DOCUMENTS

| | | |
|---|---|---|
| JP | 2003-059259 A | 2/2003 |
| JP | 2004-063004 A | 2/2004 |
| JP | 2010-232959 A | 10/2010 |
| TW | 548653 B | 8/2003 |
| TW | 201023187 A | 6/2010 |
| WO | WO-2009/028298 A1 | 3/2009 |

OTHER PUBLICATIONS

Masashi Takata et al., "Nonvolatile SRAM based on Phase Change," IEICE Technical Report ICD2006-10, Apr. 2006, pp. 49-54 (6 pages), The Institute of Electronics, Information and Communication Engineers, Japan.

International Search Report issued in Application No. PCT/JP2013/054051, mailed Mar. 26, 2013.

Zhao, Weisheng et al., "Spintronic Device based Non-volatile Low Standby Power SRAM", Symposium on VLSI, 2008, IEEE Computer Society Annual, IEE, Piscataway NJ, Apr. 7, 2008, pp. 40-45, XP031281712.

Extended European Search Report issued Jun. 6, 2015 for corresponding European Application No. 13791432.1.

Extended European Search Report issued Jun. 10, 2015 for corresponding European Application No. 13791432.1.

Office Action issued in Taiwanese Application No. 102117351, dated Jun. 11, 2015.

Office Action issued in Korean Application No. 10-2014-7032134, dated Feb. 2, 2016.

Office Action issued in Chinese Application No. 201380025692.9, dated May 13, 2016.

* cited by examiner

MEMORY CIRCUIT

CROSS-REFERENCE TO RELATED APPLICATION

This application is a continuation application of International Patent Application No. PCT/JP2013/054051, filed on Feb. 19, 2013, which claims priority to Japanese Patent Application No. 2012-114988 filed on May 18, 2012, subject matter of these patent documents is incorporated by reference herein its entirety.

TECHNICAL FIELD

The present invention relates to memory circuits, and more particularly, to a memory circuit that includes bistable circuits and nonvolatile elements, for example.

BACKGROUND ART

Data written in a bistable circuit of an SRAM (Static Random Access Memory) is stored into a ferromagnetic tunnel junction device (MTJ) in a nonvolatile manner, to cut off the power supply to the bistable circuit. After that, when the bistable circuit is turned on, the data is restored into the bistable circuit from the MTJ (see Patent Document 1, for example). Power consumption can be reduced by using this memory device in a microprocessor, a system-on-chip, a microcontroller, an FPGA (Field Programmable Gate Array), a CMOS (Complementary Metal Oxide Semiconductor) logic, or the like.

PRIOR ART DOCUMENT

Patent Document

Patent Document 1: International Publication Pamphlet WO 2009/028298 A

SUMMARY OF THE INVENTION

Problem to be Solved by the Invention

In the memory circuit disclosed in Patent Document 1, data in a bistable circuit can be stored into an MTJ in a nonvolatile manner, and accordingly, the power supply to the bistable circuit can be cut off. As a result, standby power consumption can be dramatically reduced. While power is being supplied, however, power consumption is larger than that with a conventional SRAM.

The present invention has been made in view of the above problem, and aims to reduce energy to store data into a nonvolatile element.

Means for Solving the Problem

The present invention is a memory circuit that includes: a bistable circuit that writes data; a nonvolatile element that stores the data written in the bistable circuit in a nonvolatile manner, and restores the data stored in a nonvolatile manner into the bistable circuit; and a control unit that does not store the data written in the bistable circuit into the nonvolatile element when the data in the bistable circuit is the same as the data in the nonvolatile element, but stores the data in the bistable circuit into the nonvolatile element when the data in the bistable circuit is not the same as the data in the nonvolatile element. According to the present invention, power consumption can be reduced.

In the above structure, the nonvolatile element may store the data in the bistable circuit by changing the resistance value thereof.

In the above structure, the control unit may determine whether the data in the bistable circuit is the same as the data in the nonvolatile element. The control unit does not store the data in the bistable circuit into the nonvolatile element when determining that the data in the bistable circuit is the same as the data in the nonvolatile element, but stores the data in the bistable circuit into the nonvolatile element when determining that the data in the bistable circuit is not the same as the data in the nonvolatile element.

In the above structure, the nonvolatile element may have one end connected to a node in the bistable circuit and have the other end connected to a control line, and the control unit may determine whether the data in the bistable circuit is the same as the data in the nonvolatile element based on the voltage of the control line when there is data written in the bistable circuit.

In the above structure, the bistable circuit may include a first node and a second node, the first node and the second node being complementary to each other. The nonvolatile element may include a first nonvolatile element and a second nonvolatile element, the first nonvolatile element having one end connected to the first node and the other end connected to the control line, the second nonvolatile element having one end connected to the second node and the other end connected to the control line.

The above structure may further include a readout circuit that reads out the data from the bistable circuit. The control unit may determine whether the data in the bistable circuit is the same as the data in the nonvolatile element based on an output of the readout circuit and the voltage of the control line.

In the above structure, the bistable circuit may include a first node and a second node, the first node and the second node being complementary to each other. The control line may include a first control line and a second control line. The nonvolatile element may include a first nonvolatile element and a second nonvolatile element, the first nonvolatile element having one end connected to the first node and the other end connected to the first control line, the second nonvolatile element having one end connected to the second node and the other end connected to the second control line. The control unit may determine whether the data in the first nonvolatile element and the data in the second nonvolatile element contradict each other based on the output of the readout circuit and the voltages of the first control line and the second control line.

In the above structure, the control unit may not determine whether the data in the bistable circuit is the same as the data in the nonvolatile element, when receiving a skip signal.

The present invention is a memory circuit that includes: cells each including a bistable circuit that writes data, and nonvolatile elements that store the data written in the bistable circuit into nonvolatile elements in a nonvolatile manner and restore the data stored in a nonvolatile manner into the bistable circuit; and a control unit that does not store the data in the bistable circuits into the nonvolatile elements in the cells when the data in the bistable circuits have not been rewritten in a volatile manner after data was last restored into the bistable circuit, but stores the data in the bistable circuit into the nonvolatile elements in at least one of the cells when the data in at least one of the bistable circuits has been rewritten. According to the present invention, power consumption can be reduced.

In the above structure, the control unit may determine whether the data in the bistable circuits have been rewritten in a volatile manner after data was last restored into the bistable circuit. The control unit does not store the data in the bistable circuits into the nonvolatile elements in the cells when determining that the data in the bistable circuits have not been rewritten, but stores the data in the bistable circuit into the nonvolatile elements in at least one of the cells when determining that the data in the bistable circuit has been rewritten.

In the above structure, the cells may be divided into regions, and the control unit may determine whether to store the data in the bistable circuits into the nonvolatile elements in each of the regions.

The above structure may further include a memory unit that stores information as to whether the data in at least one of the bistable circuits has been rewritten, the memory unit being provided for each of the regions.

In the above structure, each nonvolatile element is a ferromagnetic tunnel junction device.

In the above structure, when receiving a skip signal, the control unit may not determine whether the data in the bistable circuits have been rewritten in a volatile manner after data was last restored into the bistable circuit.

The present invention is a memory circuit that includes: a ferromagnetic tunnel junction device; a readout circuit that reads out data written into the ferromagnetic tunnel junction device in a nonvolatile manner; and a control unit that does not write data to be written in a nonvolatile manner into the ferromagnetic tunnel junction device when an output of the readout circuit is the same as the data to be written into the ferromagnetic tunnel junction device in a nonvolatile manner, but writes the data to be written in a nonvolatile manner into the ferromagnetic tunnel junction device when the output of the readout circuit is not the same as the data to be written in a nonvolatile manner.

In the above structure, the control unit may determine whether the output of the readout circuit is the same as the data to be written into the ferromagnetic tunnel junction device in a nonvolatile manner. The control unit may not write the data to be written in a nonvolatile manner into the ferromagnetic tunnel junction device when determining that the output of the readout circuit is the same as the data to be written in a nonvolatile manner, but writes the data to be written in a nonvolatile manner into the ferromagnetic tunnel junction device when determining that the output of the readout circuit is not the same as the data to be written in a nonvolatile manner.

In the above structure, when receiving a skip signal, the control unit may not determine whether the output of the readout circuit is the same as the data to be written into the ferromagnetic tunnel junction device in a nonvolatile manner.

Effects of the Invention

According to the present invention, power consumption can be reduced.

MODES FOR CARRYING OUT THE EMBODIMENTS

Figure 1A:
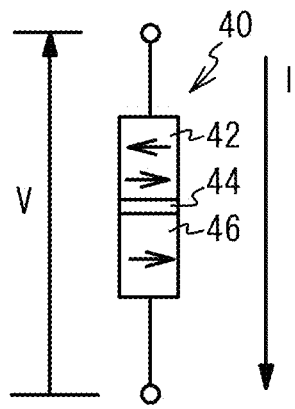
FIGS. 1A and 1C are diagrams showing an example of a ferromagnetic tunnel junction device.

First, a ferromagnetic tunnel junction device is described as a nonvolatile element. FIG. 1A is a diagram showing an example of a ferromagnetic tunnel junction device. The ferromagnetic tunnel junction device 40 includes a ferromagnetic electrode free layer 42, a ferromagnetic electrode pinned layer 46, and a tunnel insulator 44 interposed between the ferromagnetic electrode free layer 42 and the ferromagnetic electrode pinned layer 46. The ferromagnetic electrode free layer 42 and the ferromagnetic electrode pinned layer 46 are made of a ferromagnetic metal, a half-metallic ferromagnet, or a ferromagnetic semiconductor. The ferromagnetic electrode free layer 42 has a variable magnetization direction. On the other hand, the ferromagnetic electrode pinned layer 46 has a pinned magnetization direction. A state where the magnetization directions of the ferromagnetic electrode free layer 42 and the ferromagnetic electrode pinned layer 46 are parallel to each other is referred to as a parallel magnetization, and a state where the magnetization directions are antiparallel to each other is referred to as an antiparallel magnetization.

Figure 1B:
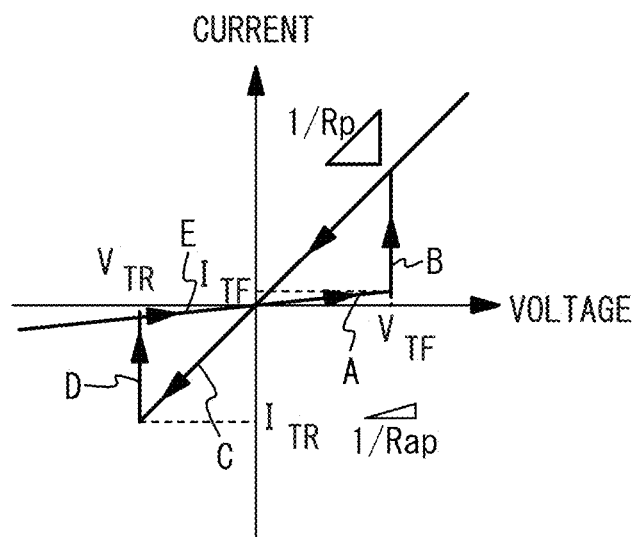
FIG. 1B is a diagram showing the current-voltage characteristics of the ferromagnetic tunnel junction device.
Figure 1C:
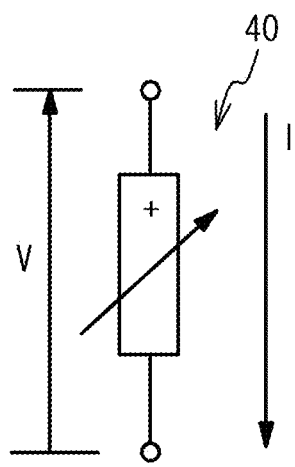

FIG. 1B is a diagram showing the current-voltage characteristics of the ferromagnetic tunnel junction device 40. As shown in FIG. 1A, a voltage that is applied to the ferromagnetic electrode free layer 42 with respect to the ferromagnetic electrode pinned layer 46 is defined as a voltage V, and a current flowing from the ferromagnetic electrode free layer 42 to the ferromagnetic electrode pinned layer 46 is defined as a current I. Symbols in the ferromagnetic tunnel junction device 40 at this point are defined as shown in FIG. 1C. As shown in FIG. 1B, the resistance Rp of the ferromagnetic tunnel junction device 40 in a parallel magnetization state is lower than the resistance Rap of the ferromagnetic tunnel junction device 40 in an antiparallel magnetization state. In general, Rp and Rap are functions of voltages applied to ferromagnetic tunnel junctions, but will be hereinafter regarded as resistances that have approximately constant resistance values. The following discussion applies even to cases where Rp and Rap are not constant resistances.

In an antiparallel magnetization state, when the voltage V to be applied to the ferromagnetic tunnel junction device 40 becomes higher, the current I increases at the rate equivalent to the reciprocal of the resistance Rap (A in FIG. 1B). When the current I exceeds a threshold current $I_{TF}$, the magnetization of the ferromagnetic electrode free layer 42 is reversed due to the majority-spin electrons of the ferromagnetic electrode pinned layer 46 injected from the ferromagnetic electrode pinned layer 46 into the ferromagnetic electrode free layer 42, and a parallel magnetization state appears (B in FIG. 1B). As a result, the resistance of the ferromagnetic tunnel junction device 40 becomes Rp. In a parallel magnetization state, on the other hand, when the negative current I flows (C in FIG. 1B) and exceeds a threshold current $I_{TR}$ in the negative direction, the minority-spin electrons of the ferromagnetic electrode free layer 42 among the electrons to be injected from the ferromagnetic electrode free layer 42 into the ferromagnetic electrode pinned layer 46 are reflected by the ferromagnetic electrode pinned layer 46. As a result, the magnetization of the ferromagnetic electrode free layer 42 is reversed, and an antiparallel magnetization state appears (D in FIG. 1B).

The method of reversing the magnetization direction of the ferromagnetic electrode free layer 42 by changing the magnetization direction through spin-polarized charge injection is called a spin-injection magnetization switching method. The spin-injection magnetization switching method has a higher possibility of reducing the power consumption required to change a magnetization direction than a method of changing a magnetization direction by generating a magnetic field. Also, unlike the method of changing a magnetization direction by generating a magnetic field, the spin-injection magnetization switching method does not have the problem of leakage magnetic fields. Accordingly, the spin-injection magnetization switching method is hardly affected by disturbances that cause inadvertent writing or erasing in cells other than selected cells, and is suitable for large-scale integration.

Figure 2:
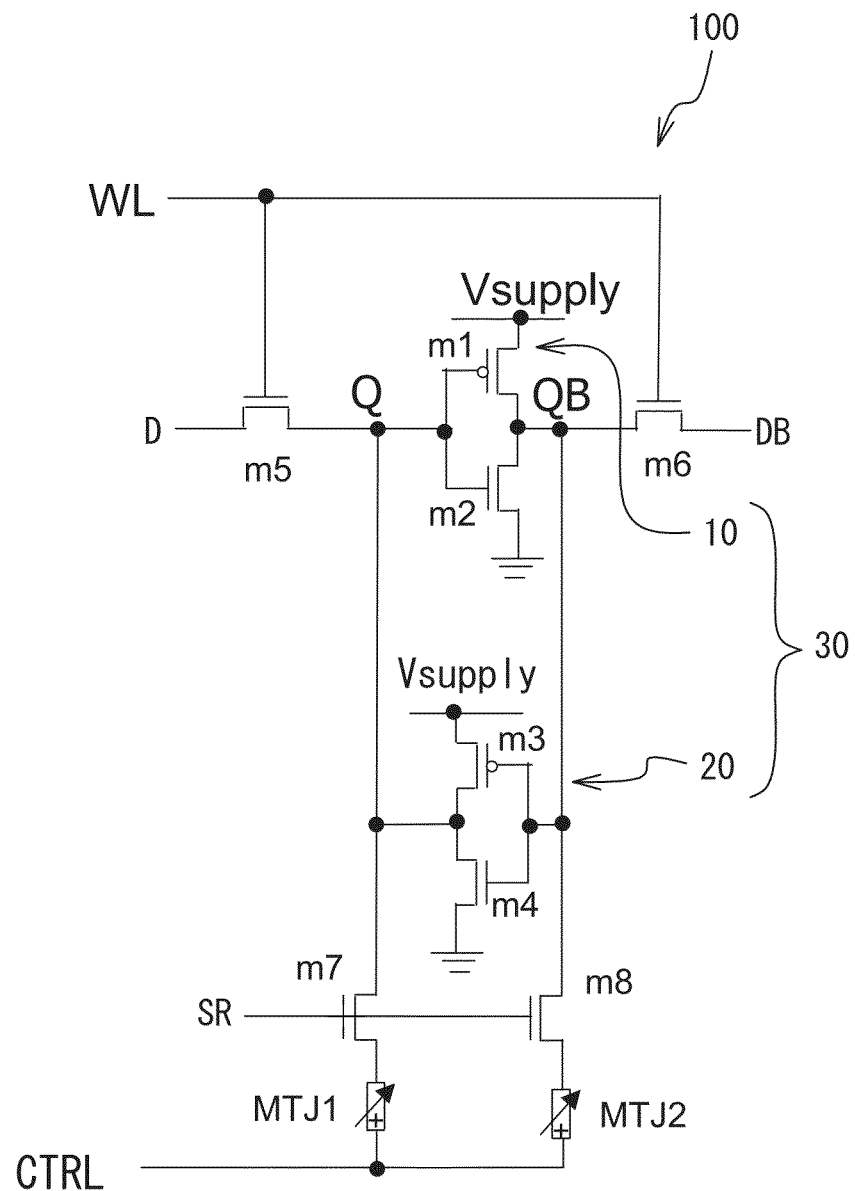
FIG. 2 is a circuit diagram of a memory cell.

Next, an example of a memory cell that includes a bistable circuit and ferromagnetic tunnel junction devices is described. FIG. 2 is a circuit diagram of the memory cell. As shown in FIG. 2, the memory cell 100 includes a first inverter circuit 10, a second inverter circuit 20, and ferromagnetic tunnel junction devices MTJ1 and MTJ2. The first inverter circuit 10 and the second inverter circuit 20 are connected in a ring-like manner, to form a bistable circuit 30. The first inverter circuit 10 includes an n-MOSFET (Metal Oxide Semiconductor Field Effect Transistor) m2 and a p-MOSFET m1. The second inverter circuit 20 includes an n-MOSFET m4 and a p-MOSFET m3.

The nodes to which the first inverter circuit 10 and the second inverter circuit 20 are connected are nodes Q and QB. The node Q and the node QB are complementary to each other, and the bistable circuit 30 is put into a stable state when the node Q and the node QB are at a high level and a low level, respectively, or when the node Q and the node QB are at a low level and a high level, respectively. The bistable circuit 30 is capable of storing data when in a stable state.

The nodes Q and QB are connected to input/output lines D and DB via MOSFETs m5 and m6, respectively. The gates of the MOSFETs m5 and m6 are connected to a word line WL. The MOSFETs m1 through m6 form a 6-MOSFET SRAM.

An FET m7 and the ferromagnetic tunnel junction device MTJ1 are connected between the node Q and a control line CTRL, and an FET m8 and the ferromagnetic tunnel junction device MTJ2 are connected between the node QB and the control line CTRL. One of the source and the drain of each of the FETs m7 and m8 is connected to the node Q/QB, and the other one of the source and the drain is connected to the ferromagnetic tunnel junction device MTJ1/MTJ2. The gates of the FETs m7 and m8 are connected to a switch line SR. Each of the FETs m7 and m8 may be connected between the ferromagnetic tunnel junction device MTJ1/MTJ2 and the control line CTRL. That is, the source and the drain of each of the FETs m7 and m8 are connected in series to the ferromagnetic tunnel junction device MTJ1/MTJ2 between the nodes Q/QB and the control line CTRL. Alternatively, the FETs m7 and m8 may not be provided.

Data is written into and read from the bistable circuit 30 in the same manner as with a conventional SRAM. Specifically, the word line WL is set at a high level to put the FETs m5 and m6 into a conduction state, and data in the input/output lines D and DB is written into the bistable circuit 30. The input/output lines D and DB are put into an equipotential floating state, and the word line WL is set at a high level to put the FETs m5 and m6 into a conduction state. In this manner, data in the bistable circuit 30 can be read out to the input/output lines D and DB. Data is held in the bistable circuit 30 by putting the FETs m5 and m6 into a cut-off state. When data writing, reading, or holding is performed in the bistable circuit 30, it is preferable to set the switch line SR at a low level, and put the FETs m7 and m8 into a cut-off state. As a result, the current flowing between the nodes Q and QB and the control line CTRL can be reduced, and power consumption can be lowered.

Figure 3:
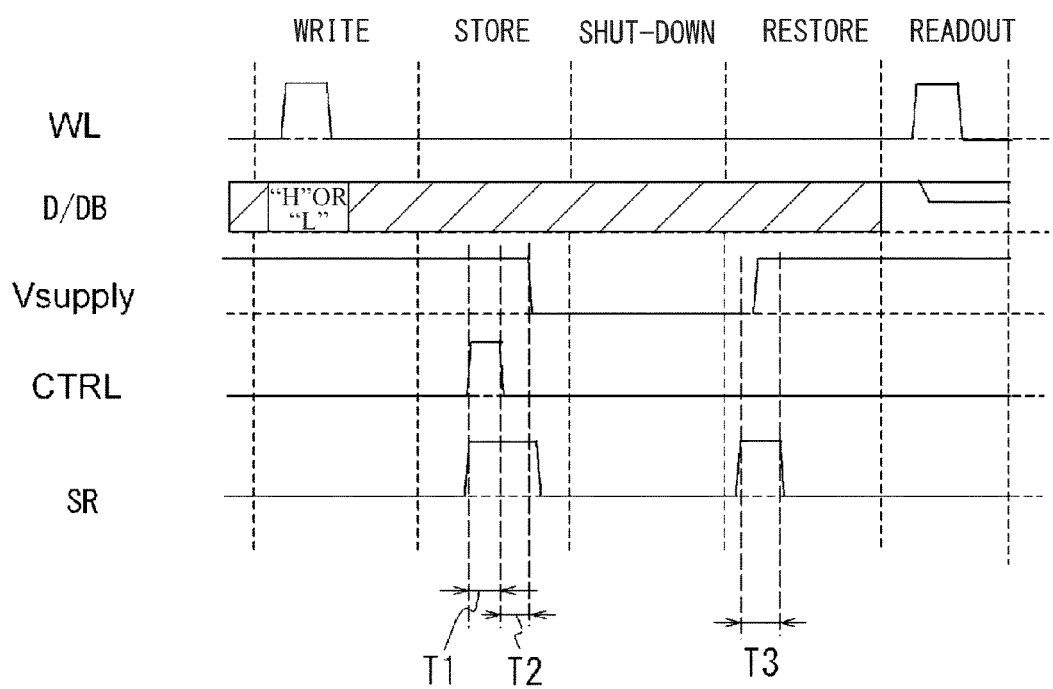
FIG. 3 is a timing chart illustrating control of the memory cell.

FIG. 3 is a timing chart illustrating control of the memory cell. The shaded portion indicates a portion in which it is not clear whether the level is high or low. As shown in FIG. 3, a supply voltage Vsupply is supplied, and the control line CTRL and the switch line SR are at a low level in initial condition. Data is written into the bistable circuit 30 by setting the word line WL at a high level and setting the input/output lines D and DB at a high and low level, respectively, or at a low and high level, respectively. Data is stored from the bistable circuit 30 into the ferromagnetic tunnel junction devices MTJ1 and MTJ2 by setting the switch line SR and the control line CTRL at a high level during a time period T1, and setting the switch line SR and the control line CTRL at a high level and low level, respectively during a time period T2.

When the nodes Q and QB are at a high level and a low level, respectively, the ferromagnetic tunnel junction devices MTJ1 and MTJ2 have a high resistance and a low resistance, respectively, at the end of T2. When the nodes Q and QB are at a low level and a high level, respectively, the ferromagnetic tunnel junction devices MTJ1 and MTJ2 have a low resistance and a high resistance, respectively, at the end of T2. In this manner, data in the bistable circuit 30 is stored into the ferromagnetic tunnel junction devices MTJ1 and MTJ2.

After that, the supply voltage Vsupply is set at 0 V, to put the memory cell into a shut-down state. As any current does not flow in the memory cell at this point, power consumption can be lowered. Data is restored into the bistable circuit 30 from the ferromagnetic tunnel junction devices MTJ1 and MTJ2 by raising the supply voltage Vsupply from 0 V while maintaining the control line CTRL at a low level and the switch line SR at a high level during a time period T3.

When the ferromagnetic tunnel junction devices MTJ1 and MTJ2 have a high resistance and a low resistance, respectively, the nodes Q and QB are at a high level and a low level, respectively, at the end of T3. When the ferromagnetic tunnel junction devices MTJ1 and MTJ2 have a low resistance and a high resistance, respectively, the nodes Q and QB are at a low level and a high level, respectively, at the end of T3. In this manner, data stored in the ferromagnetic tunnel junction devices MTJ1 and MTJ2 in a nonvolatile manner is restored into the bistable circuit.

Data is read from the bistable circuit 30 by setting the word line WL at a high level.

Figure 4A:
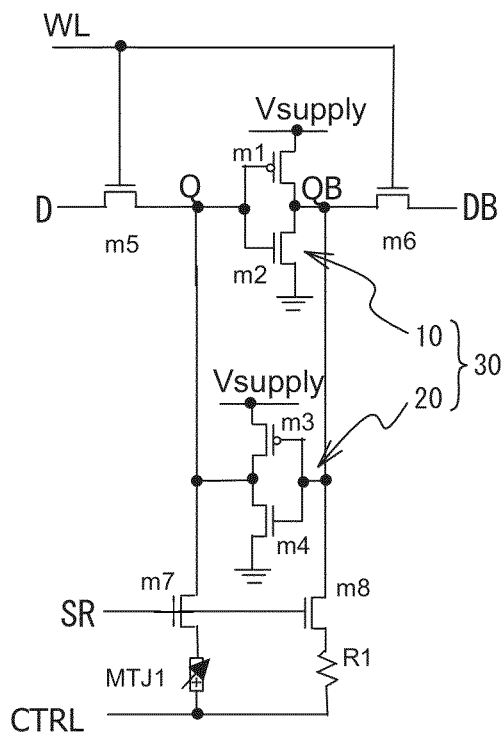
FIGS. 4A and 4B are circuit diagrams showing other examples of memory cells.
Figure 4B:
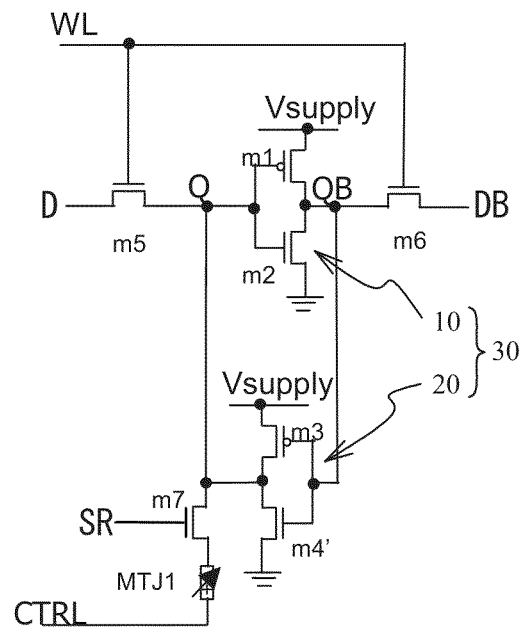

FIGS. 4A and 4B are circuit diagrams showing other examples of memory cells. As shown in FIG. 4A, a resistor R1 can be used in place of the ferromagnetic tunnel junction device MTJ2. As shown in FIG. 4B, the node QB and the control line CTRL are not connected to each other. As shown in FIGS. 4A and 4B, the ferromagnetic tunnel junction device may be connected only between one of the nodes Q and QB and the control line CTRL. The FET m7 may be connected between the ferromagnetic tunnel junction device MTJ1 and the control line CTRL in each case. Alternatively, the FET m7 may not be provided.

First Embodiment

Figure 5A:
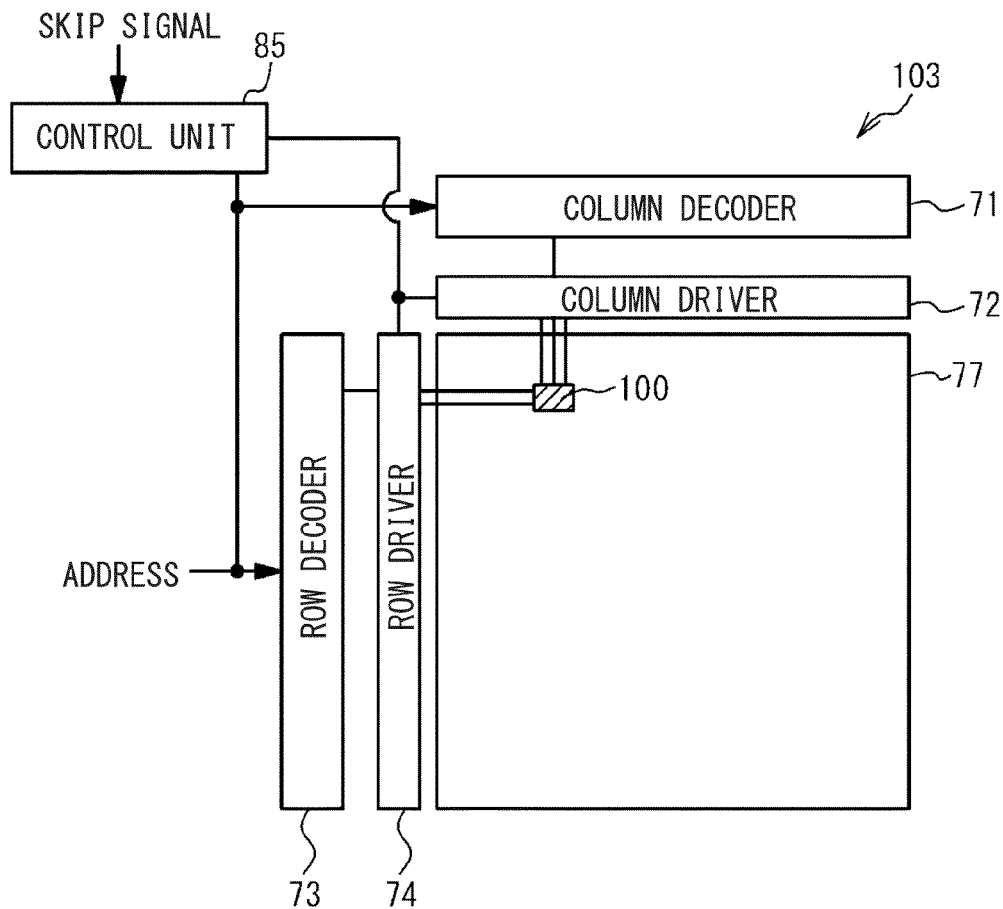
FIGS. 5A and 5B are block diagrams showing a memory circuit and a memory cell according to a first embodiment.
Figure 5B:
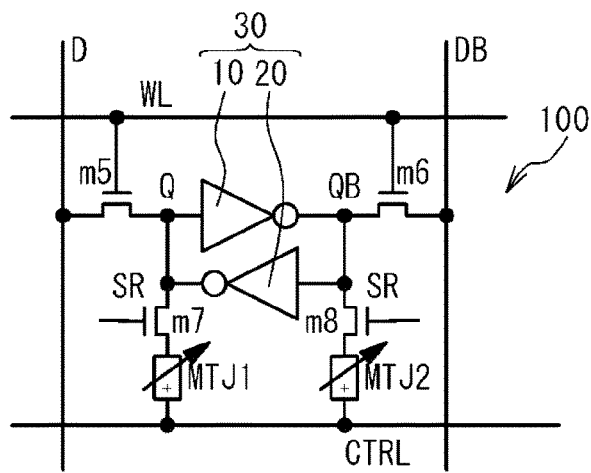

FIGS. 5A and 5B are block diagrams showing a memory circuit and a memory cell according to a first embodiment. As shown in FIG. 5A, a memory circuit 103 includes a memory area 77, a column decoder 71, a column driver 72, a row decoder 73, a row driver 74, and a control unit 85. In the memory area 77, memory cells 100 are arranged in a matrix fashion. The column decoder 71 and the row decoder 73 select a column and a row in accordance with an address signal. The column driver 72 applies a voltage or the like to the input/output lines D and DB of the selected column and the control line CTRL. The row driver 74 applies a voltage or the like to the word line WL of the selected row, the switch line SR, and the control line CTRL. The control unit 85 applies a voltage or the like to the input/output lines D and DB, the word line WL, the switch line SR, and the control line CTRL of a memory cell 100, via the column decoder 71, the column driver 72, the row decoder 73, and the row driver 74. As shown in FIG. 5B, the memory cells 100 are the same as the memory cell 100 shown in FIG. 2, for example.

When the row driver 74 applies a voltage to a control line CTRL, the control line CTRL is connected to each of the memory cells 100 arranged in one row. When the column driver 72 applies a voltage to a control line CTRL, the control line CTRL is collectively connected to the memory cells 100 arranged in a column, for example.

Figure 6:
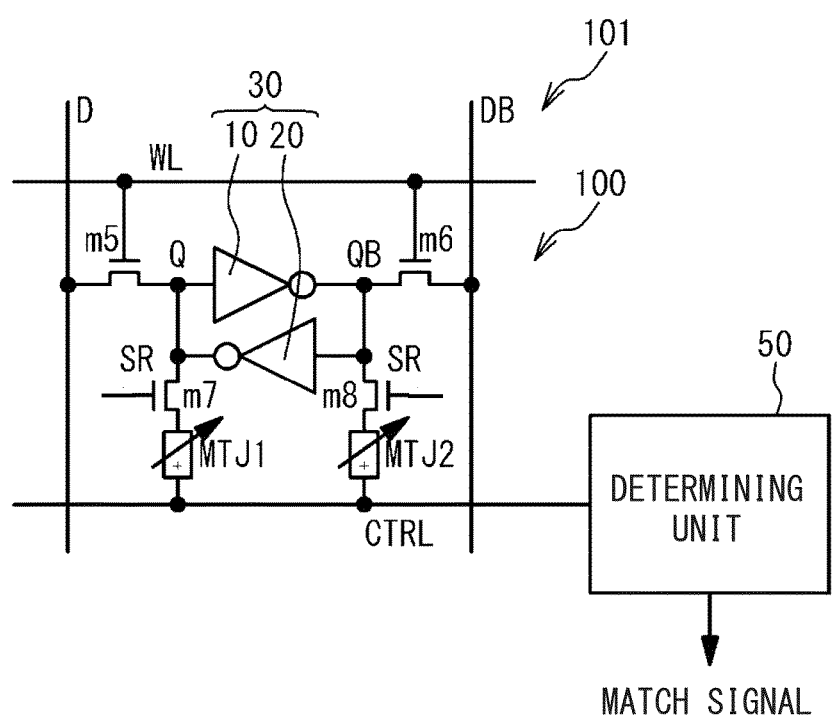
FIG. 6 is a block diagram of a memory cell and a determining unit according to the first embodiment.

FIG. 6 is a block diagram of a memory cell and a determining unit according to the first embodiment. As shown in FIG. 6, a memory circuit 101 includes the memory cell 100 shown in FIG. 2 and a determining unit 50. The structure of the memory cell 100 is the same as the structure shown in FIG. 5B, and therefore, explanation thereof is not repeated herein. When data is written into memory cells 100 in a nonvolatile manner, the determining unit 50 determines whether the data in the bistable circuit 30 is the same as the data in the ferromagnetic tunnel junction devices MTJ1 and MTJ2 in each memory cell 100. For example, when the nodes Q and QB are at a high level and a low level, respectively, and the ferromagnetic tunnel junction devices MTJ1 and MTJ2 have a high resistance and a low resistance, respectively, the data in the bistable circuit 30 is the same as the data in the ferromagnetic tunnel junction devices MTJ1 and MTJ2. When the nodes Q and QB are at a high level and a low level, respectively, and the ferromagnetic tunnel junction devices MTJ1 and MTJ2 have a low resistance and a high resistance, respectively, the data in the bistable circuit 30 is not the same as the data in the ferromagnetic tunnel junction devices MTJ1 and MTJ2. The determining unit 50 outputs a match signal indicating whether the data is the same to the control unit 85.

The control unit 85 receives a match signal for each memory cell 100 that stores data in a nonvolatile manner among the memory cells 100. When the match signal indicates that the data is the same, nonvolatile storing is not performed in the memory cell 100. When the match signal indicates that the data is not the same, nonvolatile storing is performed in the memory cell 100.

Figure 7A:
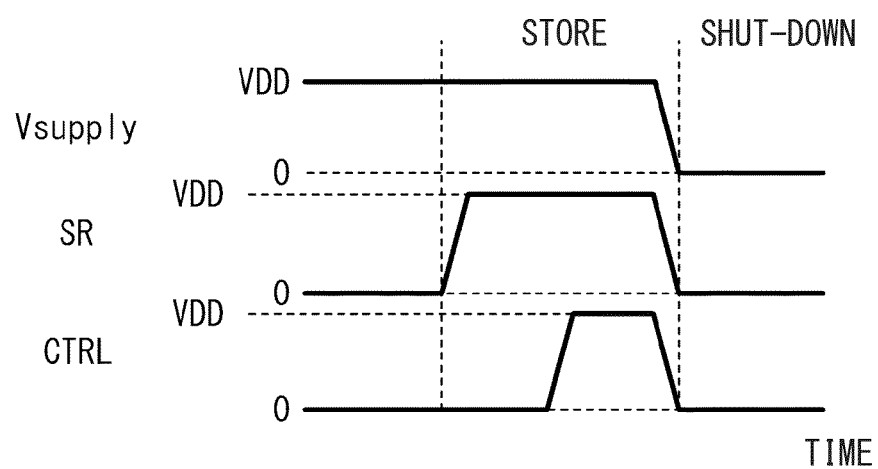
FIGS. 7A and 7B are timing charts of a power supply, a switch line, and a control line.
Figure 7B:
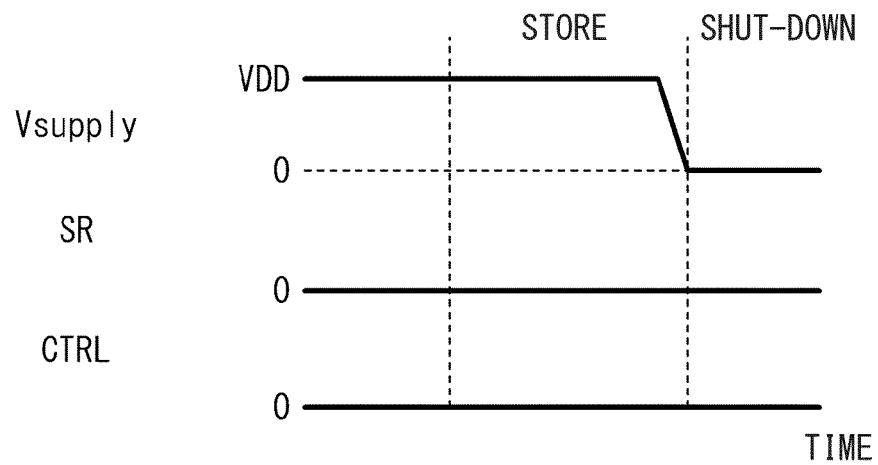

FIGS. 7A and 7B are timing charts of the power supply, the switch line, and the control line. As shown in FIG. 7A, the control unit 85 sets the voltage of the switch line SR at a high level (VDD) during a time period in which storing is performed in a memory cell 100 in which the data in the bistable circuit 30 is not the same as the data in the ferromagnetic tunnel junction devices MTJ1 and MTJ2. The control unit 85 sets the voltage of the control line CTRL at a low level (0 V) and a high level (VDD). In this manner, the data in the bistable circuit 30 is stored into the ferromagnetic tunnel junction devices MTJ1 and MTJ2. After that, the control unit 85 sets the supply voltage Vsupply at 0 V during a later shut-down period.

As shown in FIG. 7B, the control unit 85 sets the voltage of the control line CTRL at a low level (0 V) during a time period in which storing is performed in a memory cell 100 in which the data in the bistable circuit 30 is the same as the data in the ferromagnetic tunnel junction devices MTJ1 and MTJ2. As a result, the data in the bistable circuit 30 is not stored into the ferromagnetic tunnel junction devices MTJ1 and MTJ2. After that, the control unit 85 sets the supply voltage Vsupply at 0 V during a shut-down period.

According to the first embodiment, when the data in the bistable circuit 30 is the same as the data in the ferromagnetic tunnel junction devices, the control unit 85 does not store the data in the bistable circuit 30 into the ferromagnetic tunnel junction devices. When the data in the bistable circuit 30 is not the same as the data in the ferromagnetic tunnel junction devices, the data in the bistable circuit 30 is stored into the ferromagnetic tunnel junction devices. As a result, the power consumed by the storing can be reduced. As described above, in each of the memory cells 100, a check can be made to determine whether the data in the bistable circuit 30 is to be stored into the ferromagnetic tunnel junction devices. In the first embodiment, the ferromagnetic tunnel junction devices MTJ1 and MTJ2 are connected between the bistable circuit 30 and the control line CTRL. However, some other circuit structure may be used, as long as data can be stored into a nonvolatile element such as a ferromagnetic tunnel junction device in a nonvolatile manner.

Also, the control unit 85 may receive a skip signal from an external circuit. When receiving a skip signal, the control unit 85 does not determine whether the data in the bistable circuit 30 is the same as the data in the ferromagnetic tunnel junction devices. Accordingly, processing can be performed at a higher speed. The external circuit can select a higher processing speed or a reduction in power consumption through the skip signal.

In a case where the data in the bistable circuit 30 is stored by changing the resistance value of a nonvolatile element such as a ferromagnetic tunnel junction device, the control unit 85 can determine whether the data in the bistable circuit 30 is the same as the data in the ferromagnetic tunnel junction device based on the voltage of the control line CTRL when data is written in the bistable circuit 30. As shown in FIGS. 4A and 4B, only one ferromagnetic tunnel junction device may be provided between one of the nodes Q and QB in the bistable circuit 30 and the control line CTRL.

Second Embodiment

Figure 8:
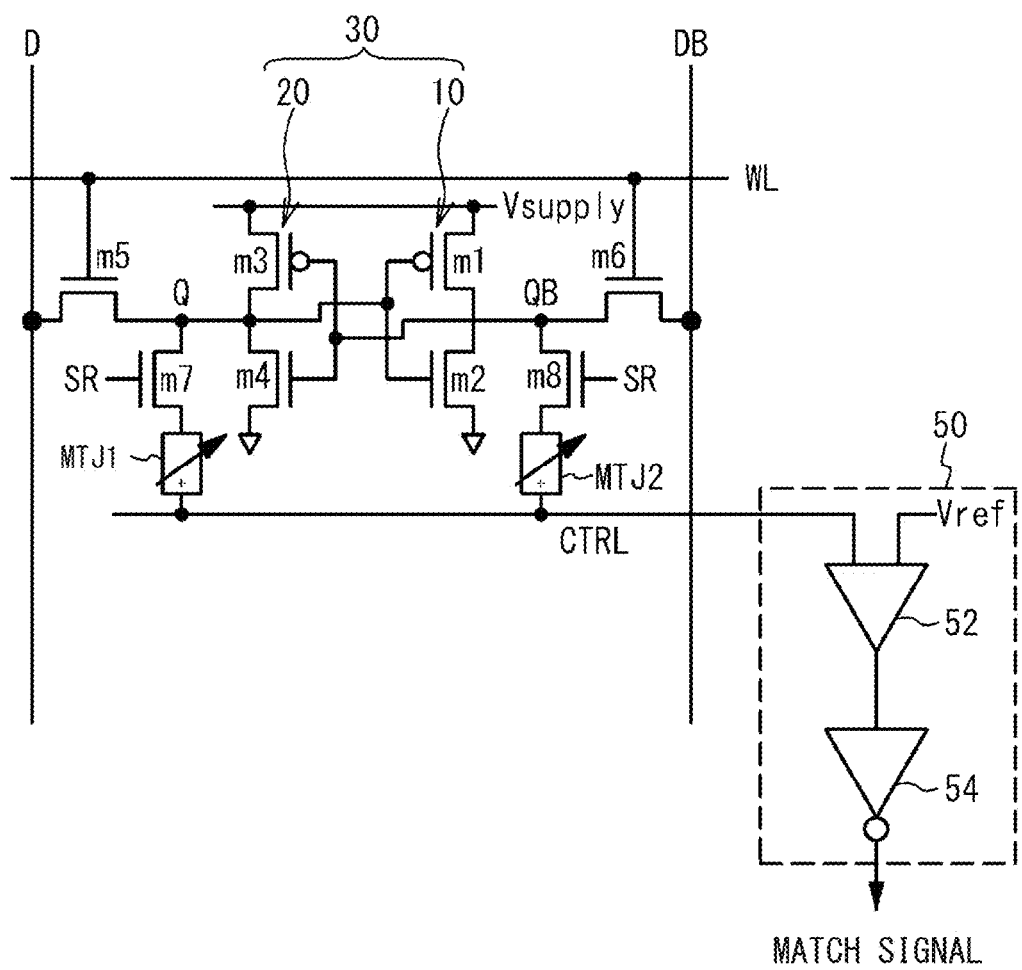
FIG. 8 is a block diagram of a memory circuit according to a second embodiment.

A second embodiment is a specific example of the first embodiment. FIG. 8 is a block diagram of a memory circuit according to the second embodiment. As shown in FIG. 8, the determining unit 50 includes a comparator 52 and an inverter 54. The comparator 52 compares the voltage of the control line CTRL with a reference voltage Vref. The inverter 53 inverts the output of the comparator 52, and outputs the result as a match signal.

Figure 9:
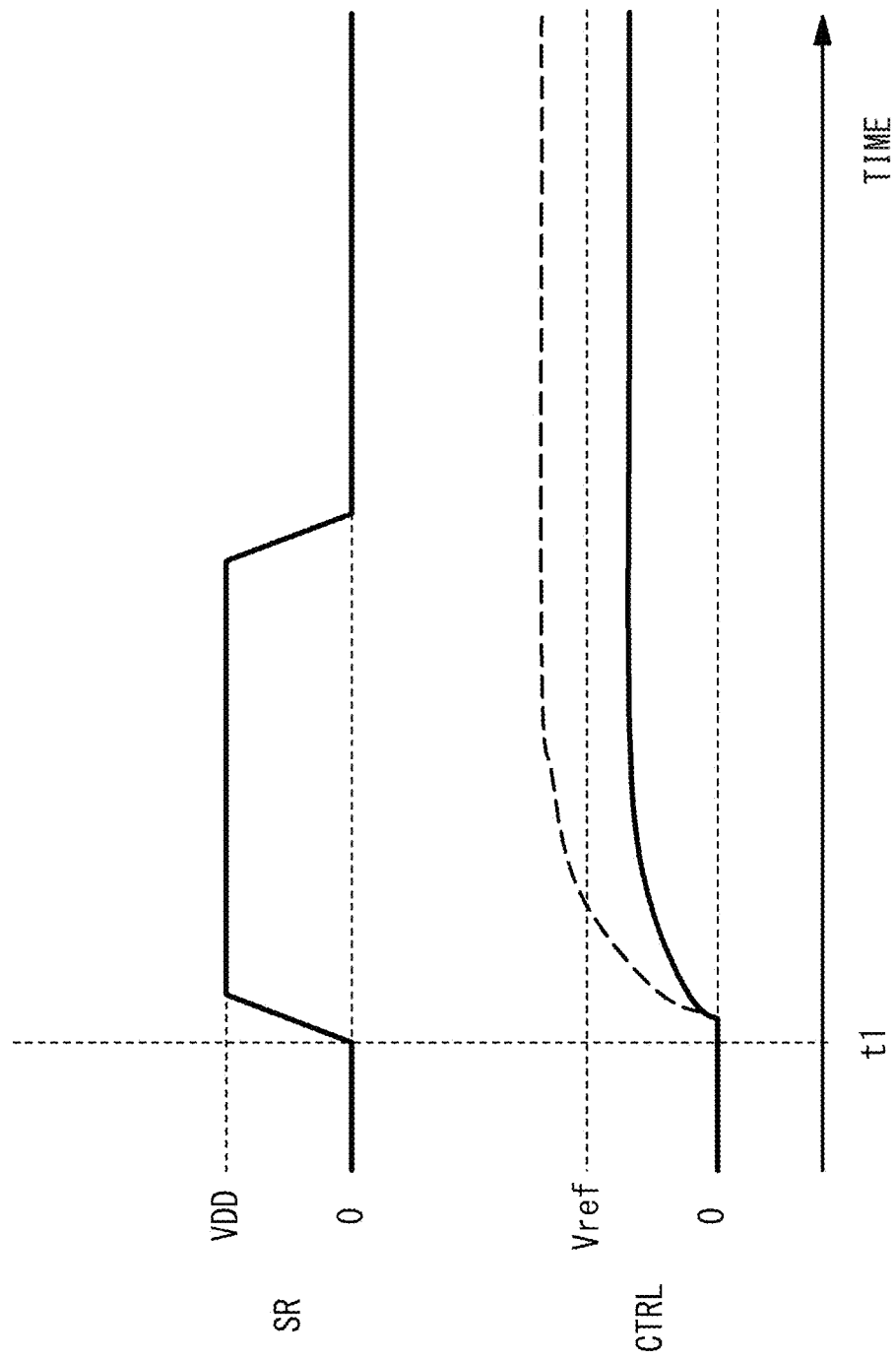
FIG. 9 is a timing chart of a switch line and a control line.

FIG. 9 is a timing chart of the switch line and the control line. The control unit 85 puts the control line CTRL into a floating state, and sets the switch line SR at a high level at time t1. When the data in the bistable circuit 30 is the same as the data in the ferromagnetic tunnel junction devices, the node Q is at a high level, the ferromagnetic tunnel junction device MTJ1 has a high resistance, the node QB is at a low level, and the ferromagnetic tunnel junction device MTJ2 has a low resistance, for example. The control line CTRL approaches the level of the node QB connected to the low-resistance ferromagnetic tunnel junction device MTJ2. As a result, the control line CTRL enters a relatively low-voltage state, as indicated by the solid line for the control line CTRL in FIG. 9.

When the data in the bistable circuit 30 is not the same as the data in the ferromagnetic tunnel junction devices, on the other hand, the node connected to the low-resistance ferromagnetic tunnel junction device is at a high level. As a result, the control line CTRL enters a relatively high-voltage state, as indicated by the dashed line in FIG. 9. In view of this, the reference voltage Vref is appropriately selected, so that a check can be made to determine whether the data in the bistable circuit 30 is the same as the data in the ferromagnetic tunnel junction devices based on the voltage of the control line CTRL. In this manner, the control unit 85 can verify the data stored in each storage cell. The reference voltage Vref may be Vsupply/2, for example.

In the second embodiment, the data in the bistable circuit 30 is stored by changing the resistance values of nonvolatile elements such as ferromagnetic tunnel junction devices. The first nonvolatile element (MTJ1) has one end connected to the node Q and the other end connected to the control line CTRL, and the second nonvolatile element (MTJ2) has one end connected to the node QB and the other end connected to the control line CTRL. In this case, the control unit 85 can determine whether the data in the bistable circuit 30 is the same as the data in the nonvolatile elements based on the voltage of the control line CTRL when data is written in the bistable circuit 30. In a case where only one ferromagnetic tunnel junction device is provided between one of the nodes Q and WB and the control line CTRL as in FIGS. 4A and 4B, a check can also be made to determine whether the data in the bistable circuit 30 is the same as the data in the nonvolatile element based on the signal (for example, the voltage or the current) of the control line CTRL.

Third Embodiment

Figure 10:
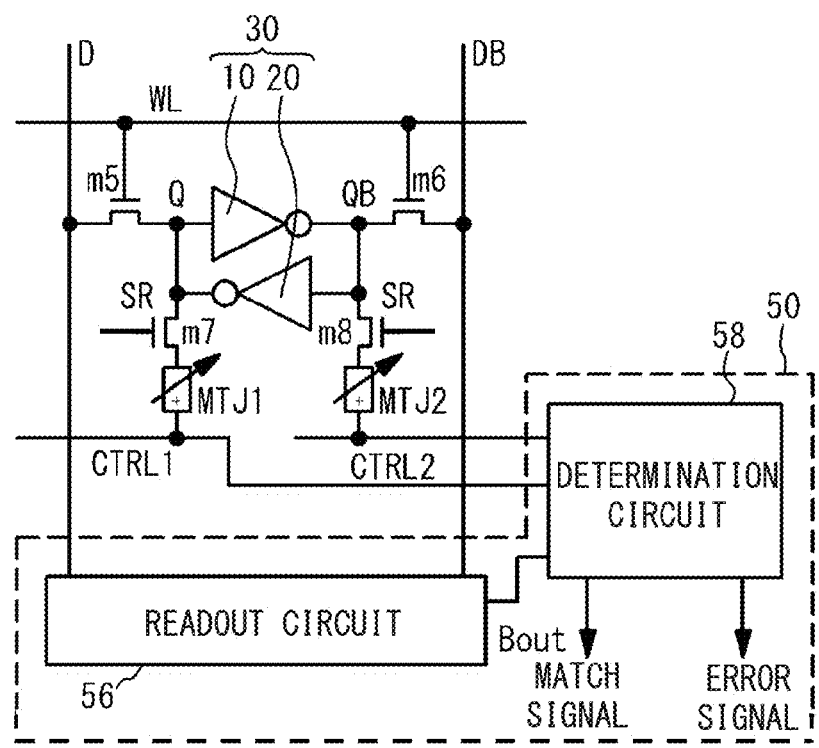
FIG. 10 is a block diagram of a memory cell and a determining unit according to a third embodiment.

A third embodiment is another specific example of the first embodiment. FIG. 10 is a block diagram of a memory cell and a determining unit according to the third embodiment. As shown in FIG. 10, the determining unit 50 includes a readout circuit 56 and a determination circuit 58. An output Bout of the readout circuit 56 is input to the determination circuit 58. The determination circuit 58 outputs a match signal and an error signal to the control unit 85. The error signal is a signal indicating whether the data stored in the ferromagnetic tunnel junction devices contradict each other. The other aspects of the structure are the same as those shown in FIG. 6, and therefore, explanation of them is not repeated herein.

Figure 11:
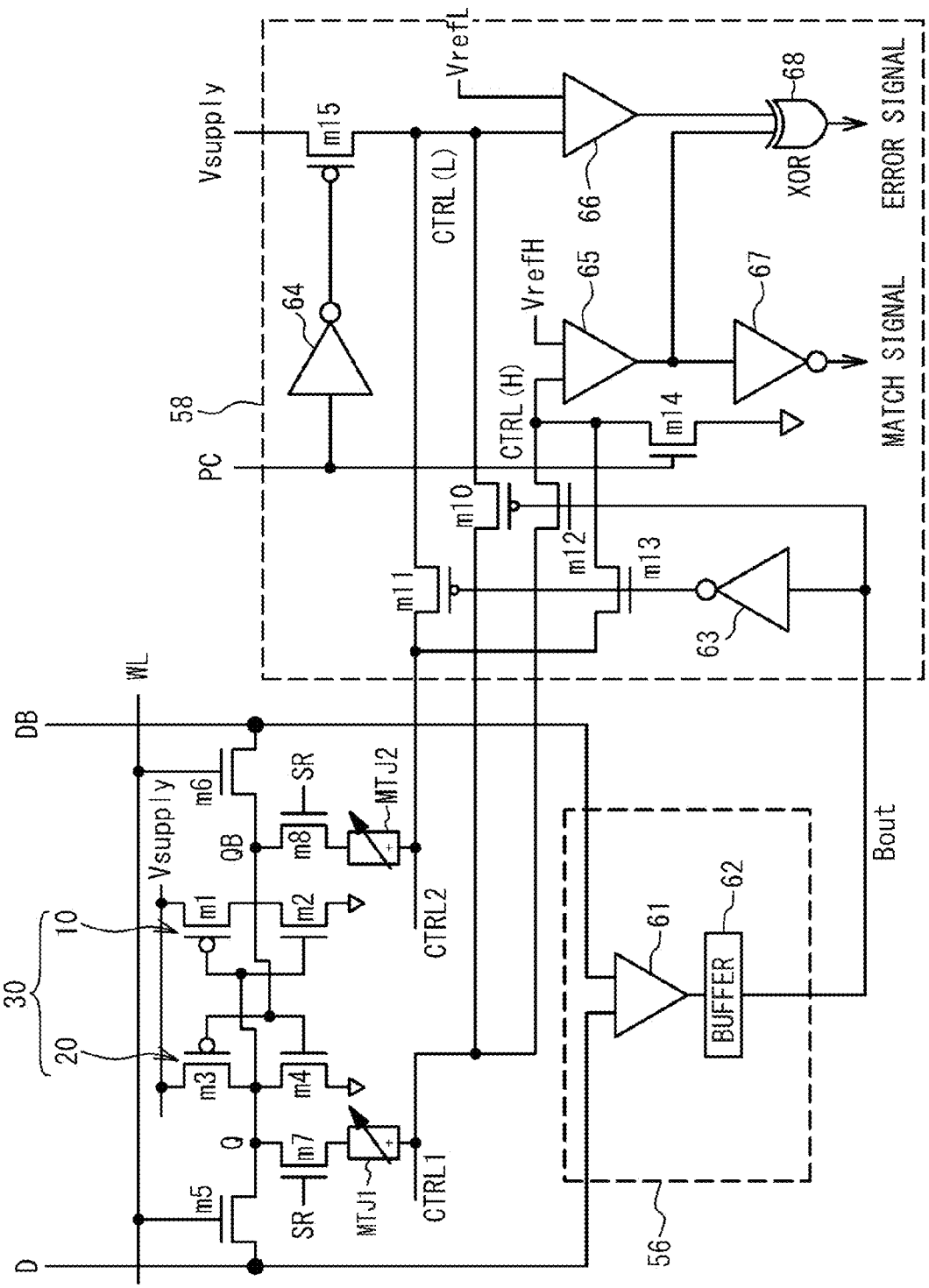
FIG. 11 is a circuit diagram of a memory circuit according to the third embodiment.

FIG. 11 is a circuit diagram of a memory circuit according to the third embodiment. As shown in FIG. 11, the readout circuit 56 includes a sense amplifier 61 and a buffer 62. The sense amplifier 61 reads out data from the bistable circuit 30. The buffer 62 holds the data read out by the sense amplifier 61.

The determination circuit 58 includes MOSFETs m10 through m15, sense amplifiers 65 and 66, inverters 63, 64, and 67, and an XOR circuit 68. The MOSFETs m10 through m13 and the inverter 63 electrically connect a control line CTRL1 or CTRL2 connected to the node Q or QB on the high-level side, to the sense amplifier 65 via a connection line CTRL(H). Also, the MOSFETs m10 through m13 and the inverter 63 electrically connect the control line CTRL1 or CTRL2 connected to the node Q or QB on the low-level side, to the sense amplifier 66 via a connection line CTRL (L). The sense amplifier 65 compares the voltage of the connection line CTRL(H) connected to the high-level node with a reference voltage VrefH. An output of the sense amplifier 65 is output as a match signal via the inverter 67.

The sense amplifier 66 compares the voltage of the connection line CTRL(L) connected to the low-level node with a reference voltage VrefL. Outputs of the sense amplifiers 65 and 66 are input to the XOR circuit 68. The XOR circuit 68 outputs an error signal. The error signal is a signal indicating whether contradictory data are stored in the two ferromagnetic tunnel junction devices. For example, when the ferromagnetic tunnel junction devices MTJ1 and MTJ2 both have a low resistance or both have a high resistance, contradictory data are stored in the two ferromagnetic tunnel junction devices. The MOSFETs m14 and m15 and the inverter 64 precharge the connection lines CTRL(H) and CTRL(L).

Figure 12:
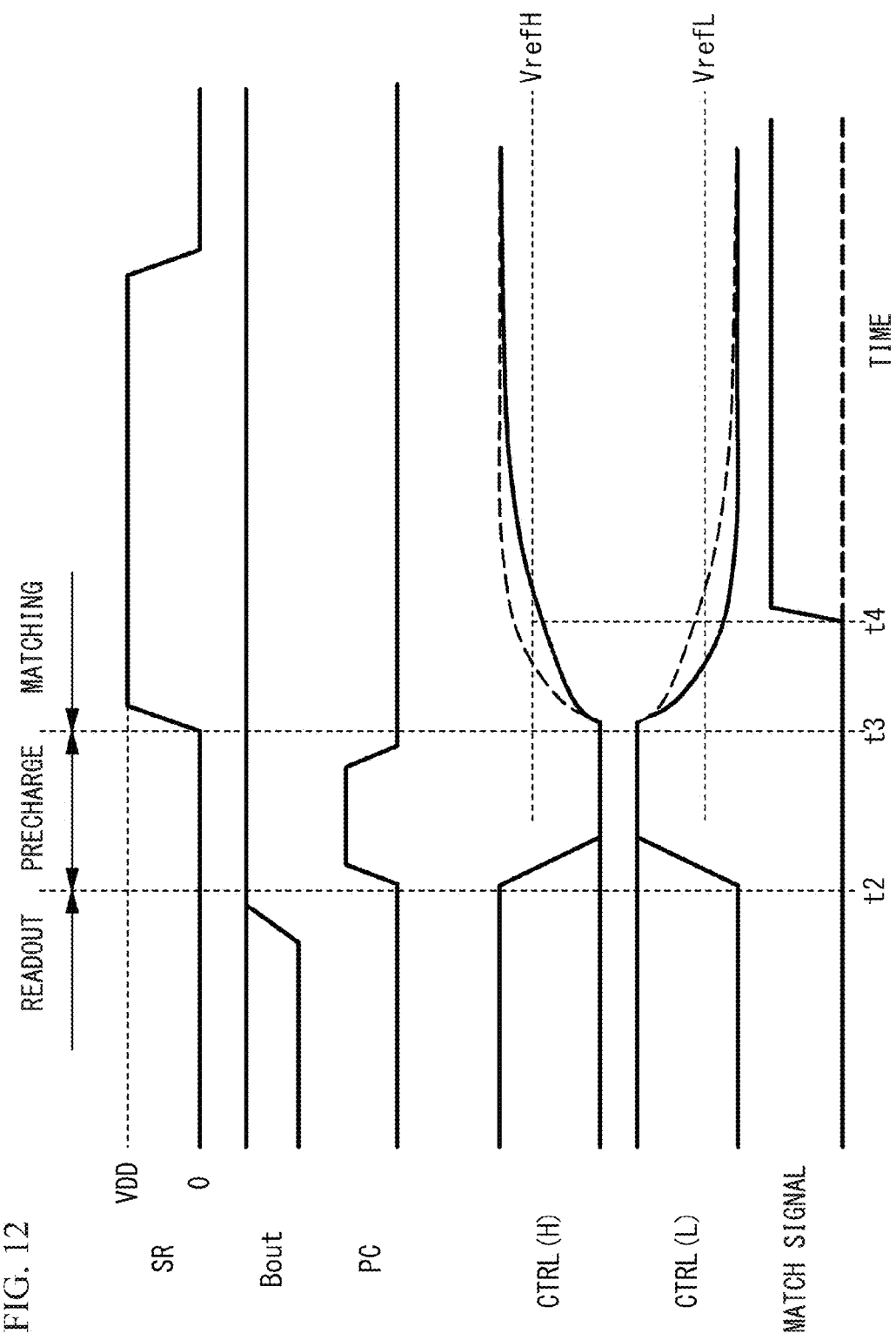
FIG. 12 is a timing chart of respective signals.

FIG. 12 is a timing chart of the respective signals. The readout circuit 56 reads out data from the bistable circuit 30. At this point, the switch line SR and the precharge PC are at a low level. The output Bout of the buffer 62 and the connection lines CTRL(H) and CTRL(L) are at a low level or a high level. The period from time t2 to time t3 is a precharge period. The precharge PC becomes high. The connection CTRL(H) and CTRL(L) are precharged at a low level and at a high level, respectively.

At time t3, the switch line SR switches to a high level, and the precharge PC switches to a low level. The voltage of the connection line CTRL(H) varies as indicated by the solid line when the corresponding ferromagnetic tunnel junction device has a high resistance (when the data is the same). The voltage of the connection line CTRL(H) varies as indicated by the dashed line when the corresponding ferromagnetic tunnel junction device has a low resistance (when the data is not the same). At time t4, the voltage of the connection line CTRL(H) is compared with the reference voltage VrefH, so that a check can be made to determine whether the data is the same as the data in the ferromagnetic tunnel junction device corresponding to the high-level node. The voltage of the connection line CTRL(L) varies as indicated by the solid line when the corresponding ferromagnetic tunnel junction device has a low resistance (when the data is the same). The voltage of the connection line CTRL(L) varies as indicated by the dashed line when the corresponding ferromagnetic tunnel junction device has a high resistance (when the data is not the same). At time t4, the voltage of the connection line CTRL(L) is compared with the reference voltage VrefL, so that a check can be made to determine whether the data is the same as the data in the ferromagnetic tunnel junction device corresponding to the low-level node.

According to the third embodiment, the control unit 85 can determine whether the data in the bistable circuit 30 is the same as the data in the ferromagnetic tunnel junction devices based on the output Bout of the readout circuit 56 and the voltages of the control lines, as shown in FIG. 10. For example, a check can be made to determine whether the data is the same, even in a case where only one ferromagnetic tunnel junction device is provided between the node Q or QB in the bistable circuit 30 and the control line CTRL as in FIGS. 4A and 4B.

Also, in a case where the two ferromagnetic tunnel junction devices MTJ1 and MTJ2 are connected between the two nodes Q and QB in the bistable circuit 30 and the connection lines CTRL(H) and CTRL(L), respectively, the control unit 85 can determine whether the data in the ferromagnetic tunnel junction device MTJ1 and the data in the ferromagnetic tunnel junction device MTJ2 contradict each other based on the output Bout of the readout circuit and the voltages of the control line CTRL1 (the first control line) and the control line CTRL2 (the second control line).

Fourth Embodiment

Figure 13:
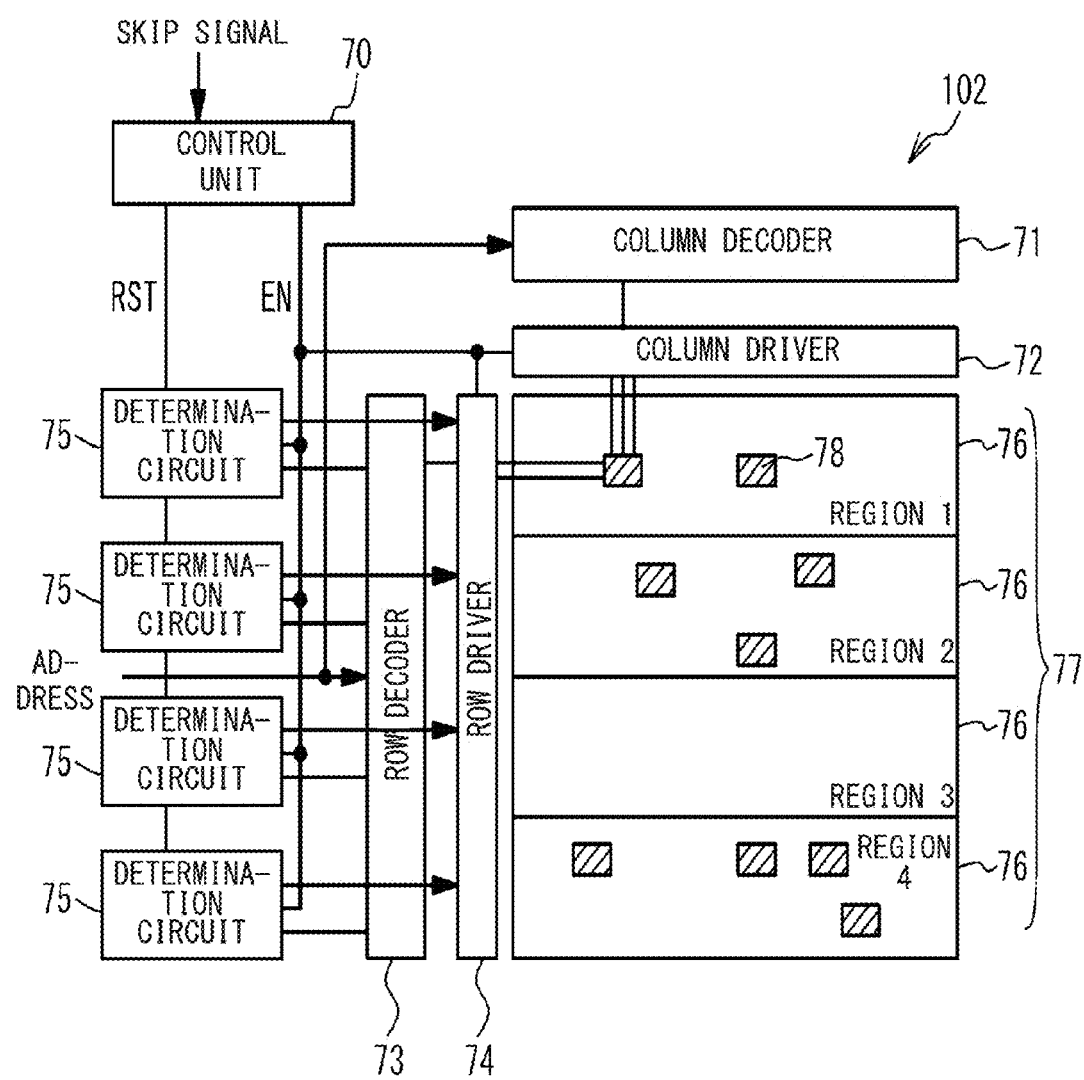
FIG. 13 is a block diagram of a memory circuit according to a fourth embodiment.

FIG. 13 is a block diagram showing a memory circuit according to a fourth embodiment. As shown in FIG. 13, the memory circuit 102 includes a memory area 77, a column decoder 71, a column driver 72, a row decoder 73, a row driver 74, determination circuits 75, and a control unit 70. In the memory area 77, memory cells are arranged in a matrix fashion. The memory cells are the same as the memory cell shown in FIG. 2, FIG. 4A, or FIG. 4B, for example. The memory area 77 is divided into regions 76. The column decoder 71 and the row decoder 73 select a column and a row in accordance with an address signal. The column driver 72 applies a voltage or the like to the input/output lines of the selected column and the control line. The row driver 74 applies a voltage or the like to the word line WL of the selected row, the switch line, and the control line. Each determination circuit 75 determines whether data in a memory cell in the corresponding region 76 has been rewritten in a volatile manner in a predetermined period of time. For example, data in a memory cell 78 in FIG. 13 has been rewritten in a volatile manner.

Figure 14:
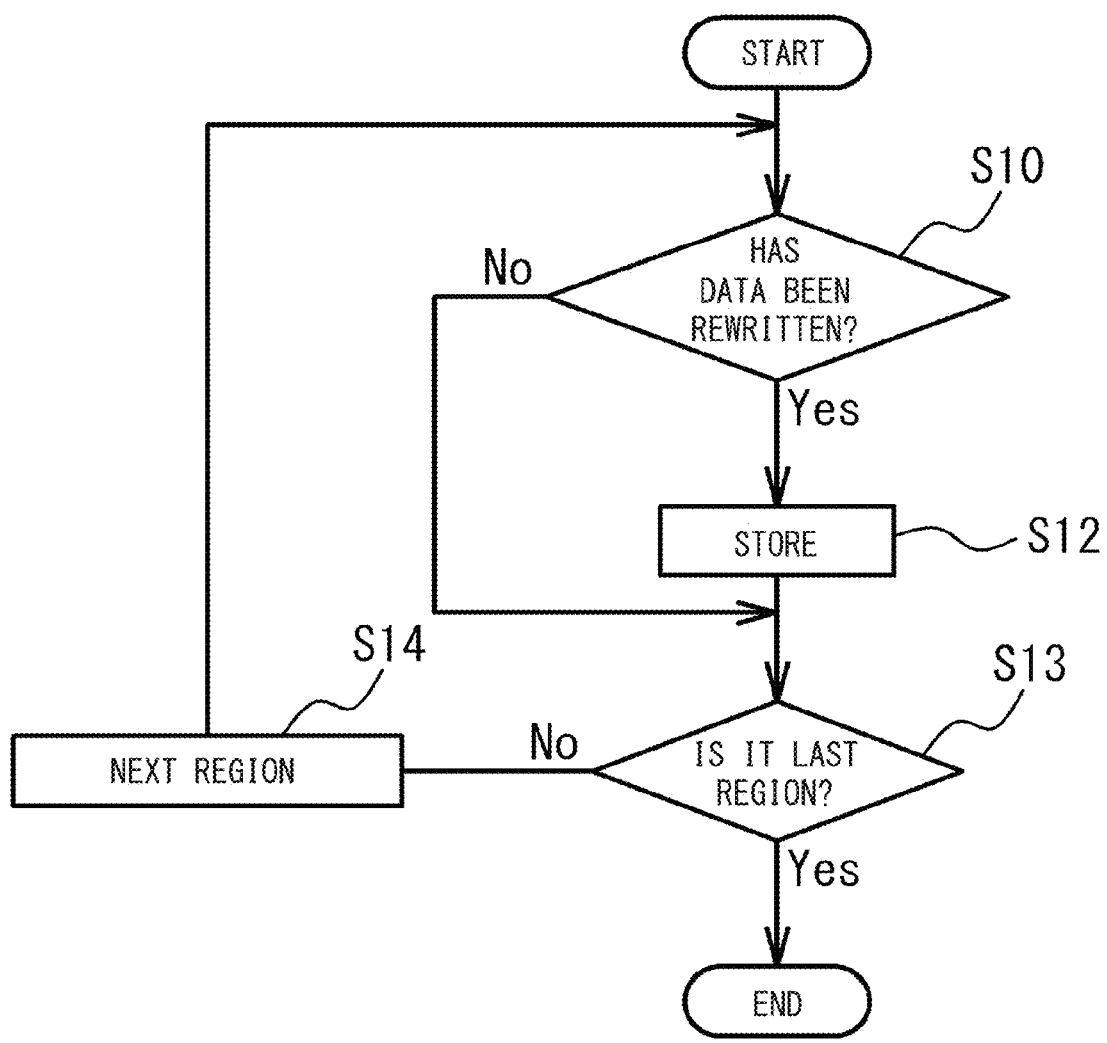
FIG. 14 is a flowchart showing the process to be performed by the control unit at the time of storing.

FIG. 14 is a flowchart showing a process to be performed by the control unit at the time of storing. As shown in FIG. 14, at the time of storing, the control unit 70 determines whether data in bistable circuits have been rewritten in a volatile manner after data was last restored into a bistable circuit 30 (step S10). If the determination result indicates "Yes", the control unit 70 stores the data in the bistable circuit 30 into nonvolatile elements (such as ferromagnetic tunnel junction devices) in a nonvolatile manner in each of the memory cells in the region 76 (step S12). If the determination result indicates "No", storing is not performed in the region 76. The control unit 70 determines whether the current region 76 is the last region 76 (step S13). If the determination result indicates "Yes", the process comes to an end. If the determination result indicates "No", the process returns to step S10.

In step S12, a check may be made to determine whether to store the data in the bistable circuit 30 into the nonvolatile elements in each memory cell, as in the first through third embodiments.

According to the fourth embodiment, the control unit 70 does not store the data in the bistable circuits 30 into the nonvolatile elements, if the data in bistable circuits 30 have not been rewritten in a volatile manner after data was last restored into a bistable circuit 30. If data in at least one of the bistable circuits 30 has been rewritten, on the other hand, the data in the bistable circuit 30 in at least one of the memory cells is stored into the nonvolatile elements. As described above, the data in the bistable circuits 30 are not stored into the nonvolatile elements, if the data in the bistable circuits 30 have not been rewritten in a volatile manner. Accordingly, the power consumed by storing can be reduced.

Furthermore, the memory cells are divided into the regions 76, and the control unit 70 can determine whether to store the data in the bistable circuits 30 into the nonvolatile elements in each of the regions.

Figure 15:
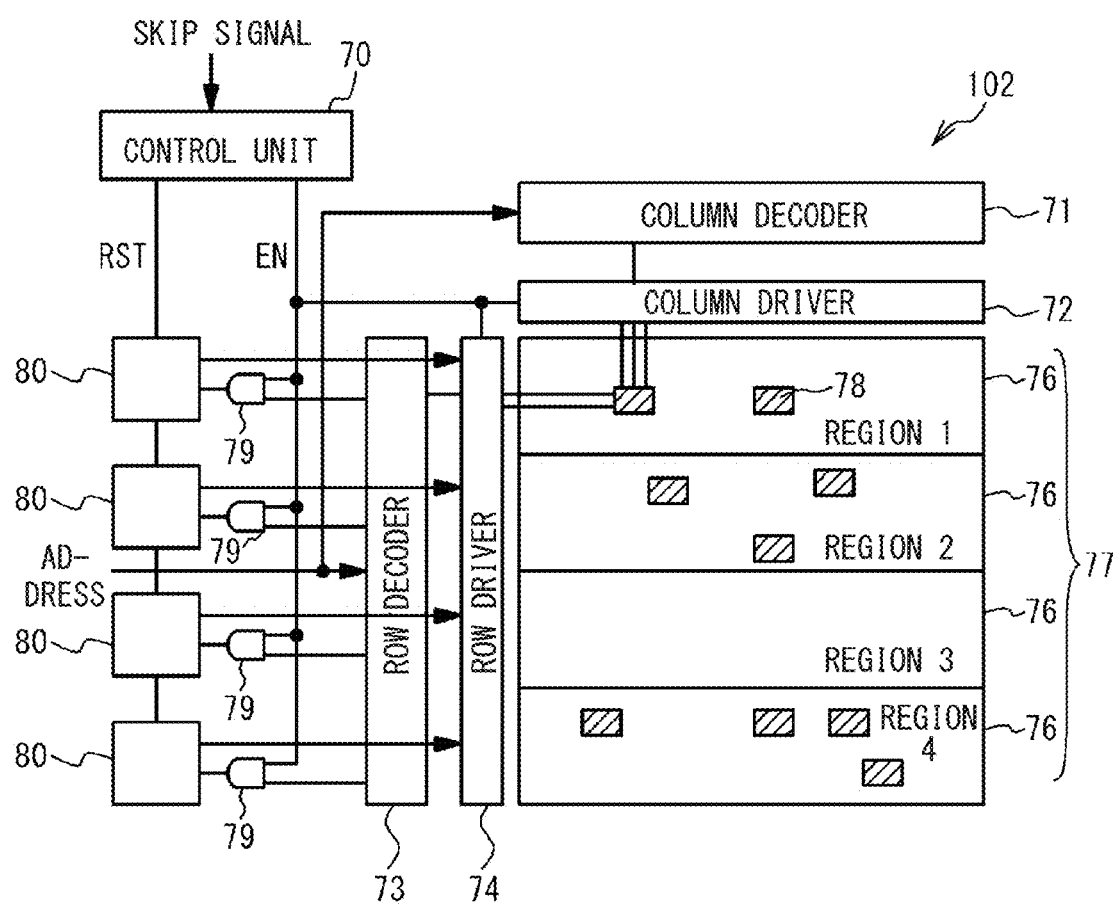
FIG. 15 is a block diagram of a memory circuit according to a modification of the fourth embodiment.

FIG. 15 is a block diagram showing a memory circuit according to a modification of the fourth embodiment. As shown in FIG. 15, for each of the regions 76, an AND circuit 79 and an SRFF (an SR flip-flop) 80 are provided in place of each of the determination circuits 75 shown in FIG. 13. Each AND circuit 79 performs an AND operation on a rewrite enabling signal EN and a signal indicating whether the memory cell to be rewritten in a volatile manner is located in the corresponding region 76. For example, a check can be made to determine whether the memory cell to be rewritten is located in a specific region 76 in accordance with an address signal. The AND circuit 79 outputs a high-level signal when a memory cell in the corresponding region 76 is to be rewritten, and outputs a low-level signal when any of the memory cells in the corresponding region 76 is not to be rewritten. Each SRFF 80 stores a high level when a high level is input thereto once. Based on the output of the SRFF 80, the control unit 70 can determine whether a memory cell in the region 76 has been rewritten in a volatile manner in a predetermined period of time. The control unit 70 can reset the output of the SRFF 80 to a low level by using a reset signal RST. For example, when restoring is performed, the determining unit 50 resets the SRFF 80.

As in the modification of the fourth embodiment, the storage units (the SRFFs 80) store information as to whether the data in at least one of the bistable circuits 30 has been rewritten in each of the regions 76. Accordingly, the control unit 70 can readily determine whether the data in at least one of the bistable circuits 30 has been rewritten.

In the fourth embodiment and the modification thereof, the control unit 70 may receive a skip signal from an external circuit. When receiving a skip signal, the control unit 70 does not determine whether the data in the bistable circuits 30 have been rewritten in a volatile manner after data was last restored into a bistable circuit 30. Accordingly, processing can be performed at a higher speed. The external circuit can select a higher processing speed or a reduction in power consumption through the skip signal.

In the above described first through fourth embodiments and the modifications thereof, ferromagnetic tunnel junction devices are used as nonvolatile elements, but some other nonvolatile elements may be used. For example, the nonvolatile elements may be variable resistance devices that use CER (Colossal Electro-Resistance) effects used in a ReRAM (Resistive Random Access Memory) or the like. Also, the nonvolatile elements may be variable phase devices or ferroelectric devices, for example.

Fifth Embodiment

Figure 16:
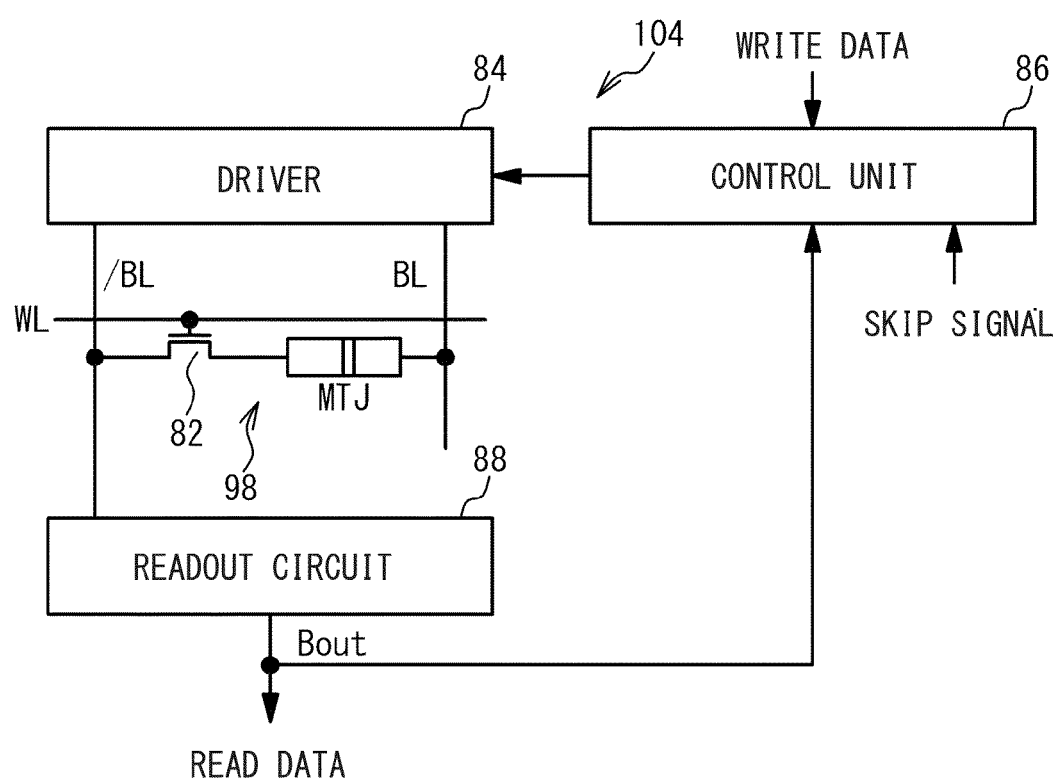
FIG. 16 is a block diagram of a memory circuit according to a fifth embodiment.

A fifth embodiment is an example of an MRAM (Magnetic Random Access Memory). FIG. 16 is a block diagram of a memory circuit according to the fifth embodiment. The memory circuit 104 includes MOSFETs 82 and ferromagnetic tunnel junction devices MTJ that form memory cells 98. One of the source and the drain of each MOSFET 82 is connected to a bit line /BL. The other one of the source and the drain of each MOSFET 82 is connected to a bit line BL via the corresponding ferromagnetic tunnel junction device MTJ. The gate of each MOSFET 82 is connected to a word line WL. The memory cells 98 are arranged in a matrix fashion.

The bit lines /BL and BL are connected to a driver 84. The driver 84 writes data into a memory cell 98 in a nonvolatile manner. For example, the driver 84 sets one of the bit lines /BL and BL at a high level, and sets the other one of the bit lines /BL and BL at a low level. The word line WL is set at a high level, to put the MOSFET 82 into a conduction state. As a result, a current flows in the ferromagnetic tunnel junction device MTJ. Depending on the direction of the current flowing in the ferromagnetic tunnel junction device MTJ, the ferromagnetic tunnel junction device MTJ can have a low resistance or a high resistance, as described above with reference to FIGS. 1A through 1C. In this manner, data can be written into the ferromagnetic tunnel junction device in a nonvolatile manner.

Each bit line /BL is connected to a readout circuit 88. The readout circuit 88 reads out data written into a ferromagnetic tunnel junction device MTJ in a nonvolatile manner. The bit line BL is set at a high level, and the bit line /BL is put into a floating state. The word line WL is set at a high level, to put the MOSFET 82 into a conduction state. As the readout circuit 88 detects the potential of the bit line /BL, a check can be made to determine whether the ferromagnetic tunnel junction device MTJ has a low resistance or a high resistance. In this manner, data written into the ferromagnetic tunnel junction device MTJ can be read out. The read data is output as read data Bout.

Write data and read data are input to a control unit 86. The control unit 86 determines whether the write data and the read data are the same. When the write data and the read data are not the same, the control unit 86 writes the write data into the ferromagnetic tunnel junction device MTJ of the memory cell 98. When the write data and the read data are the same, the control unit 86 does not write the write data into the ferromagnetic tunnel junction device MTJ of the memory cell 98.

Figure 17:
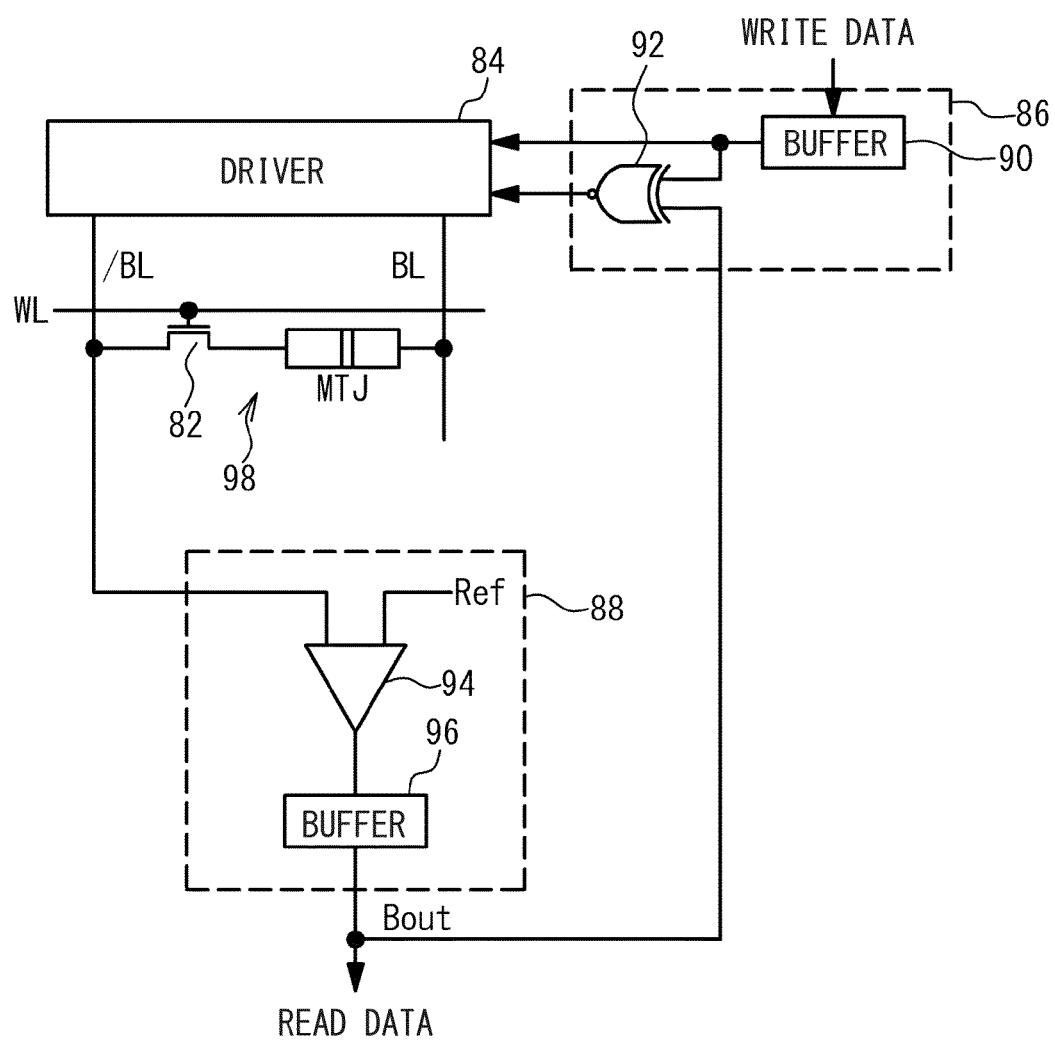
FIG. 17 is a more specific block diagram of the memory circuit according to the fifth embodiment.

FIG. 17 is a more specific block diagram of the memory circuit according to the fifth embodiment. The readout circuit 88 includes a sense amplifier 94 and a buffer 96. The sense amplifier 94 reads out data from a memory cell 98, depending on whether the potential of the corresponding bit line /BL is lower than a reference potential Ref. The read data is held in the buffer 96. The control unit 86 includes a buffer 90 and an XNOR circuit 92. Write data is held in the buffer 90. The write data held in the buffer 90 and the read data held in the buffer 96 are input to the XNOR circuit 92. The XNOR circuit outputs a high level when the write data and the read data are the same, and outputs a low level when the write data and the read data are not the same. When the output of the XNOR circuit 92 is a high level, the driver 84 does not write the write data into the memory cell 98. For example, the driver 84 sets the bit lines /BL and BL at the same potential, or puts the bit lines /BL and BL into a floating state. As a result, any data is not written into the ferromagnetic tunnel junction device MTJ even when the word line WL switches to a high level. When the output of the XNOR circuit 92 is a low level, the write data is written into the memory cell 98.

According to the fifth embodiment, when an output of the readout circuit 88 is the same as the data to be written into a ferromagnetic tunnel junction device MTJ in a nonvolatile manner, the control unit 86 does not write the write data. When the output of the readout circuit 88 is not the same as the data to be written in a nonvolatile manner, on the other hand, the control unit 86 writes the write data into the ferromagnetic tunnel junction device. The power consumed when data is written into a ferromagnetic tunnel junction device MTJ is much larger than the power consumed when data is read out from a ferromagnetic tunnel junction device MTJ. Therefore, when the data written in a ferromagnetic tunnel junction device MTJ is the same as the data to be written into the ferromagnetic tunnel junction device MTJ, the writing is not performed. In this manner, power consumption can be reduced.

The control unit 86 may receive a skip signal from an external circuit. When receiving a skip signal, the control unit 86 does not determine whether an output of the readout circuit 88 is the same as the data to be written into a ferromagnetic tunnel junction device in a nonvolatile manner. Accordingly, processing can be performed at a higher speed. The external circuit can select a higher processing speed or a reduction in power consumption through the skip signal.

Although a voltage sense amplifier is used in reading out data in the above described first through fifth embodiments, it is also possible to use a current sense amplifier.

The memory circuits according to the first through fifth embodiments can be used in cache memories, register files, or registers, for example. In a case where write conditions are very strict when data is written into a nonvolatile memory such as a flash memory, a write operation might be repeated on cells while a check is made to determine (verify) whether writing has been properly performed, so as to avoid wrong writing. In the memory circuits of the first through fifth embodiments, a check is made to determine (verify) whether data that has already been properly written is the same as the data to be written thereon, which differs from the above mentioned verifying operation. Since the above mentioned verification to avoid wrong writing is normally repeated many times, such a verifying operation is not used in a high-speed memory such as a cache memory. In the memory circuits of the first through fifth embodiments, on the other hand, the verifying operation to determine whether the data is the same is performed only once for a writing operation. Accordingly, high-speed detection can be performed, and the first through fifth embodiments can be applied to high-speed memories such as a cache memory.

Although preferred embodiments of the present invention have been described so far, the present invention is not limited to those particular embodiments, and various changes and modifications may be made to them within the scope of the invention claimed herein.

DESCRIPTION OF REFERENCE NUMERALS 10, 20 inverter
30 bistable circuit
70, 85, 86 control unit
MTJ1, MTJ2 ferromagnetic tunnel junction device

The invention claimed is:

1. A memory circuit comprising:
a plurality of memory cells each including a bistable circuit configured to write data, and a nonvolatile element configured to store the data written in the bistable circuit in a nonvolatile manner and restore the data stored in a nonvolatile manner into the bistable circuit;
a control line connected to the nonvolatile element; and
a control unit configured to determine whether the data in the bistable circuit is the same as data in the nonvolatile element in each memory cell of the plurality of memory cells, the control unit not applying a voltage for storing the data written in the bistable circuit into the nonvolatile element to the control line when determining that the data in the bistable circuit is the same as the data in the nonvolatile element, the control unit applying the voltage for storing the data in the bistable circuit into the nonvolatile element to the control line when determining that the data in the bistable circuit is not the same as the data in the nonvolatile element.

2. The memory circuit according to claim 1, wherein the nonvolatile element stores the data in the bistable circuit by changing the resistance value thereof.

3. The memory circuit according to claim 1, wherein the nonvolatile element has one end connected to a node in the bistable circuit and has the other end connected to the control line, and
the control unit determines whether the data in the bistable circuit is the same as the data in the nonvolatile element based on a voltage of the control line when there is data written in the bistable circuit.

4. The memory circuit according to claim 3, wherein the bistable circuit includes a first node and a second node, the first node and the second node being complementary to each other, and
the nonvolatile element includes a first nonvolatile element and a second nonvolatile element, the first nonvolatile element having one end connected to the first node and the other end connected to the control line, the second nonvolatile element having one end connected to the second node and the other end connected to the control line.

5. The memory circuit according to claim 1, wherein, when receiving a skip signal, the control unit does not determine whether the data in the bistable circuit is the same as the data in the nonvolatile element.

6. The memory circuit according to claim 1, wherein the nonvolatile element is a ferromagnetic tunnel junction device.

7. A memory circuit comprising:
a plurality of memory cells each including a bistable circuit configured to write data, and a nonvolatile element configured to store the data written in the bistable circuit in a nonvolatile manner and restore the data stored in a nonvolatile manner into the bistable circuit;
a readout circuit configured to read out the data from the bistable circuit;
a control unit configured to determine whether the data in the bistable circuit is the same as data in the nonvolatile element in each memory cell of the plurality of memory cells, the control unit not storing the data written in the bistable circuit into the nonvolatile element when determining that the data in the bistable circuit is the same as the data in the nonvolatile element, the control unit storing the data in the bistable circuit into the nonvolatile element when determining that the data in the bistable circuit is not the same as the data in the nonvolatile element, wherein
the nonvolatile element has one end connected to a node in the bistable circuit and has the other end connected to a control line,
the control unit determines whether the data in the bistable circuit is the same as the data in the nonvolatile element based on an output of the readout circuit and the voltage of the control line.

8. The memory circuit according to claim 7, wherein the bistable circuit includes a first node and a second node, the first node and the second node being complementary to each other,
the control line includes a first control line and a second control line,
the nonvolatile element includes a first nonvolatile element and a second nonvolatile element, the first nonvolatile element having one end connected to the first node and the other end connected to the first control line, the second nonvolatile element having one end connected to the second node and the other end connected to the second control line, and
the control unit determines whether data in the first nonvolatile element and data in the second nonvolatile element contradict each other based on the output of the readout circuit and voltages of the first control line and the second control line.

9. A memory circuit comprising:
a plurality of cells each including a bistable circuit configured to write data, and a nonvolatile element configured to store the data written in the bistable circuit in a nonvolatile manner and restore the data stored in a nonvolatile manner into the bistable circuit, the cells being divided into a plurality of regions each including at least two of the cells; and
a control unit configured to determine whether the data in the bistable circuit in at least one of the cells included in a corresponding region has been rewritten in a volatile manner after data was last restored into the bistable circuit in each of the regions, the control unit not storing the data in the bistable circuits into the nonvolatile element in the cells included in the corresponding region when determining that the data in the bistable circuit has not been rewritten, the control unit storing the data in the bistable circuits into the nonvolatile element in the cells included in the corresponding region when determining that the data in the bistable circuit has been rewritten.

10. The memory circuit according to claim 9, further comprising
a memory unit configured to store information as to whether the data in at least one of the bistable circuits has been rewritten, the memory unit being provided for each of the regions.

11. The memory circuit according to claim 9, wherein, when receiving a skip signal, the control unit does not determine whether the data in the bistable circuits have been rewritten in a volatile manner after data was last restored into the bistable circuit.

12. A memory circuit comprising:
a ferromagnetic tunnel junction device;
a readout circuit configured to read out data that has already been properly written into the ferromagnetic tunnel junction device in a nonvolatile manner; and
a control unit configured not to write data to be written in a nonvolatile manner into the ferromagnetic tunnel junction device when an output of the readout circuit is the same as the data to be written into the ferromagnetic tunnel junction device in a nonvolatile manner, and configured to write the data to be written in a nonvolatile manner into the ferromagnetic tunnel junction device when the output of the readout circuit is not the same as the data to be written in a nonvolatile manner.

13. The memory circuit according to claim 12, wherein the control unit determines whether the output of the readout circuit is the same as the data to be written into the ferromagnetic tunnel junction device in a nonvolatile manner, the control unit not writing the data to be written in a nonvolatile manner into the ferromagnetic tunnel junction device when determining that the output of the readout circuit is the same as the data to be written in a nonvolatile manner, the control unit writing the data to be written in a nonvolatile manner into the ferromagnetic tunnel junction device when determining that the output of the readout circuit is not the same as the data to be written in a nonvolatile manner.

14. The memory circuit according to claim 13, wherein, when receiving a skip signal, the control unit does not determine whether the output of the readout circuit is the same as the data to be written into the ferromagnetic tunnel junction device in a nonvolatile manner.

* * * * *